Nov. 15, 1966 R. J. TURNER 3,286,132
PRINTED CIRCUIT BOARD AND COMPONENT WITH IMPROVED
MOUNTING BASE FOR THE COMPONENT
Filed Nov. 18, 1963

INVENTOR.
RUSSELL J. TURNER
BY L E Carnahan
AGENT

United States Patent Office 3,286,132
Patented Nov. 15, 1966

3,286,132

PRINTED CIRCUIT BOARD AND COMPONENT WITH IMPROVED MOUNTING BASE FOR THE COMPONENT

Russell J. Turner, Bellevue, Wash., assignor to The Boeing Company, Seattle, Wash., a corporation of Delaware Filed Nov. 18, 1963, Ser. No. 324,457
1 Claim. (Cl. 317—101)

This invention relates to the assembly of electrical components, and more particularly to mounting means for microelectronic devices and their associated lead wires wherever it is required that the leads be spread and the microelectronic device by rigidly mounted.

In the art of printed circuits it is frequently the practice to attach components to panels carrying the conductive strips through the agency of the components lead wires. In attaching a component by this method its lead wires are first inserted through apertures that pierce both the insulating panel and the conductive strips which define the circuit. The wires are then cut to desired lengths and bent toward the printed circuit and permanently attached thereto by soldering to the printed wiring.

As is well known to those skilled in the art, considerable effort has been directed to the miniaturization of electronic assemblies thus reducing the size of the circuit components. In addition, many installations require the leads from the components be spread with the component being rigidly held to the printed circuit panel or board. Thus, much effort has been directed to means for mounting the microelectronic components which provide the following features: (1) the mounting means holds the component rigidly to a printed circuit board with the proper lead spacing; (2) the over-all height of the mounting means is modified without changing the diameter of the lead spread required by the printed circuit panel or board; and (3) the mounting means are applied to mass production operation wherein the proper lead spacing of the component is preformed by the mounting means and then the leads are mechanically inserted through apertures that pierce both the insulating panel and the conductive strips which define the circuit.

Therefore, an object of this invention is to provide a mounting means for electronic components.

A further object of the invention is to provide a microelectronic component mounting and lead adapter base for use with printed circuit boards.

A still further object of this invention is to provide a fluted mounting base for holding microelectronic components rigidly to a printed circuit board with the proper lead spacing predetermined by the flutes of the base.

Another object of the invention is to provide a grooved mounting base for electronic components wherein the over-all height of the component may be modified without changing the pin circle diameter required by the printed circuit panel or board.

Another object of the invention is to provide a fluted mounting base for microelectronic components which may be applied to a mass production operation.

Other objects of the invention will become readily apparent from the following description and drawings wherein.

Figure 2:
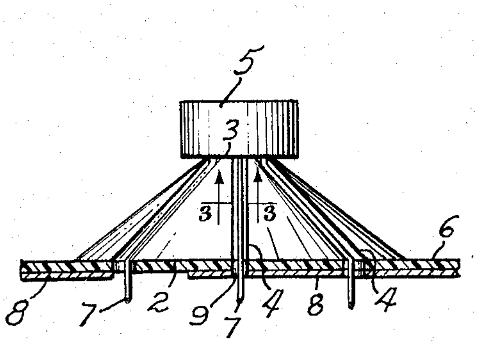
FIGURE 2 is a view taken generally in side elevation showing a mounting base of the present invention on a panel, with an electrical component mounted on said base and connected electrically to conductive strips of said panel.

Referring now to the drawings, the electronic component mounting base of the invention comprises a body of electrical insulating material 1 having the shape of a frustum of a cone with the bottom portion 2 being larger in cross-sectional configuration than the upper portion 3, thus providing a stable mounting base for an electronic component (shown at 5 in FIGURE 2) which is positioned on upper portion 3. The lower portion 2 of body 1 rests against the associated panel or board (shown at 6).

Figure 1:
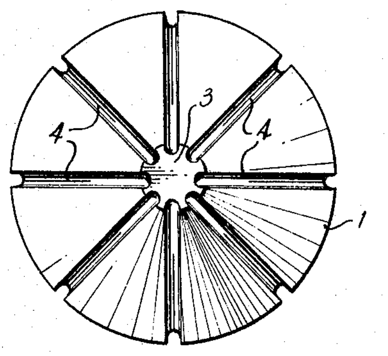
FIGURE 1 is a plan view of one embodiment of the invention.
Figure 3:
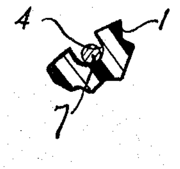
FIGURE 3 is a sectional view taken on line 3—3 of FIGURE 2 and showing the cross-section of one of the flutes.

Body 1 is provided with a plurality of flutes or grooves 4 which extend between the upper and lower portions 2 and 3. The lead wires 7 of the associated electronic component 5 extend along the flutes or grooves 4 and are guided and properly spaced by flutes 4 whereby the leads can then be inserted through holes 9 in the board 6 and attached to circuit bars 8 of the associated panel 6. FIGURE 3 clearly illustrates one configuration of a flute or groove 4.

The associated electronic component 5 is rigidly held to the printed circuit panel or board 6 by the lead wires 7 which extend through flutes 4 and are attached to the panel 6.

The specific application of the mounting base determines the height and cross-section of the base, and the number and cross-sectional configuration of the flutes or grooves.

It has thus been shown that the accrued advantages of the invention are as follows:

(1) The fluted mounting base will hold a microelectronic component rigidly to a printed circuit board with the proper lead spacing predetermined by the flutes of the base.

(2) The height of the fluted mounting base component may be modified without changing the pin circle diameter.

(3) The fluted mounting base mav be applied to a mass production operation where the leads of microelectronic components are preformed and the mounting bases mechanically inserted.

Although a particular embodiment of the invention has been illustrated and described, it will be obvious to those skilled in the art that various changes and modifications may be made without departing from the invention, and it is intended to cover in the appended claim all such changes and modifications that come within the true spirit and scope of the invention.

What I claim is:

In a microelectronic article of manufacture of the character described comprising, an insulating panel and electrically conductive strips that define a circuit of a printed circuit board, said insulating panel and said electrically conductive strips having aligned apertures formed therein arranged in a circular pattern, and a microelectronic component having an electrically conductive lead wire extending through each of the aligned apertures in the insulating panel and the electrically conductive strips and rigidly electrically connected to the electrically conductive strips, the improvement comprising; mounting means disposed between the microelectronic component and the insulating panel for seating the microelectronic component thereon and spreading the electrically conductive lead wires from the microelectronic component so that said lead wires extend through the aligned apertures formed in both the insulating panel and the electrically conductive strips that define the circuit of the printed circuit board, said mounting means comprising a frusto-conical body of electrical insulating material having an end portion bearing against the underside of the microelectronic component and an opposite end portion of greater cross-sectional area bearing against the insulating panel, said body having grooves formed in the outer peripheral conical surface thereof and extending from one end to the opposite end thereof to radially spread and guide an electrically conductive lead wire in each said groove thereof from the microelectronic component mounted on said one end of said mounting means into a corresponding aligned aperture in the insulating panel and the electrically conductive strip, and said lead wires being rigidly electrically connected to the electrically conductive strip.

References Cited by the Examiner

UNITED STATES PATENTS

| | | | |
|---|---|---|---|
| 1,140,050 | 5/1915 | Manwaring et al. | 174—174 |
| 1,484,447 | 2/1924 | Gear | 174—156 |
| 2,686,963 | 8/1954 | Freyssinet | 24—126 X |
| 2,999,895 | 9/1961 | Smith | 174—138 |
| D. 200,157 | 1/1965 | Vincent. | |

FOREIGN PATENTS

| | | |
|---|---|---|
| 825,566 | 12/1951 | Germany. |

LARAMIE E. ASKIN, *Primary Examiner.*

ROBERT K. SCHAEFER, *Examiner.*